United States Patent [19]

Butler et al.

[11] Patent Number: 5,047,683

[45] Date of Patent: Sep. 10, 1991

[54] HYBRID TRANSDUCER

[75] Inventors: John L. Butler, Marshfield, Mass.; Arthur Clark, Adelphi, Md.

[73] Assignee: Image Acoustics, Inc., North Marshfield, Mass.

[21] Appl. No.: 521,111

[22] Filed: May 9, 1990

[51] Int. Cl.[5] .............. H01L 41/08

[52] U.S. Cl. .............. 310/334; 310/26; 310/328; 310/323

[58] Field of Search .............. 310/334, 323, 328, 321, 310/322, 26, 337, 325; 367/155, 158, 159

[56] References Cited

U.S. PATENT DOCUMENTS

| | | | |
|---|---|---|---|
| 2,941,110 | 6/1960 | Yando | 310/334 |
| 2,989,725 | 6/1953 | Miller | 310/334 |
| 3,043,967 | 9/1990 | Clearwaters | 310/334 |
| 3,177,382 | 1/1961 | Green | 310/334 |
| 3,230,505 | 1/1966 | Parker et al. | 310/337 |
| 3,924,259 | 12/1975 | Butler et al. | 340/5 |
| 3,992,693 | 12/1972 | Martin et al. | 310/337 |
| 4,373,143 | 2/1983 | Lindberg | 310/334 |
| 4,432,080 | 2/1984 | Wardle | 367/163 |
| 4,435,794 | 3/1984 | Marshall et al. | 367/155 |
| 4,438,509 | 3/1984 | Butler et al. | 367/156 |
| 4,443,731 | 5/1984 | Butler et al. | 310/26 |
| 4,446,544 | 5/1984 | Connolly | 310/337 |
| 4,742,499 | 5/1988 | Butler | 367/157 |
| 4,754,441 | 6/1988 | Butler | 367/157 |
| 4,779,020 | 10/1988 | Konno et al. | 310/334 |
| 4,845,688 | 6/1989 | Butler | 367/174 |
| 4,858,206 | 8/1989 | McMahon | 310/337 |
| 4,864,548 | 9/1989 | Butler | 367/155 |

FOREIGN PATENT DOCUMENTS

| | | | |
|---|---|---|---|
| 0713339 | 8/1954 | United Kingdom | 310/328 |

*Primary Examiner*—Mark O. Budd
*Assistant Examiner*—Thomas M. Dougherty
*Attorney, Agent, or Firm*—Wolf, Greenfield & Sacks

[57] ABSTRACT

A hybrid transducer having mass and compliance loading for permitting operation at a lower frequency. The mass loading may include the use of one or more pistons to couple the energy to the medium. A ring configuration of the transducer is also disclosed. The ring moves with maximum motion at one position and minimum motion at a position 180° thereto.

64 Claims, 4 Drawing Sheets

HYBRID TRANSDUCER

BACKGROUND OF THE INVENTION

1. Field of the Invention

The present invention relates in general to transducers, and more particularly to acoustic transducers. The present invention also relates to a hybrid form of a transducer preferably a unitary piezoelectric magnetostrictive transducer.

2. Background Discussion

A hybrid transducer construction is shown in my earlier granted U.S. Pat. No. 4,443,731. This transducer construction employs both a magnetostrictive and a piezoelectric section constructed of different magnetostrictive and piezoelectric materials. In at least one embodiment of the invention as described in this earlier patent, the magnetostrictive and piezoelectric segments are intercoupled in series allowing cancellation of motion at one end of the transducer and maximization of the motion at the other end thereof. In essence, such a transducer provides a large front to back ratio for motion at its two ends. With a large radiating surface or in an array environment, a directional beam of sound is obtained.

As described in this prior patent, the different piezoelectric and magnetostrictive segments are constructed to produce a generally linear transducer that is in a bar or rod construction. In this patent the device is described a one in which the total length is equal to one half wavelength of sound with each section being one quarter wavelength in length in the respective materials. This allows the waves from either section to arrive in proper phase at the opposite ends and add at one end while cancelling at the other end. This device is thus in particular useful as a unidirectional transducer.

It is a general object of the present invention to provide a hybrid transducer that is generally of the type described in this prior art patent but which is of improved construction.

Another object of the present invention is to provide a hybrid transducer in accordance with the preceding object and which employs mass and also preferably compliance loading which in particular permits operation at a lower frequency.

Still another object of the present invention is to provide an improved unidirectional hybrid transducer which is in particular adapted for use with a piston or mass construction to provide efficient use thereof for coupling energy to the medium.

A further object of the present invention is to provide a unidirectional hybrid transducer that can be constructed in a ring configuration.

SUMMARY OF THE INVENTION

To accomplish the foregoing and other objects, features and advantages of the invention there is provided an improved hybrid transducer construction that employs mass and preferably also compliance loading which permits operation of the transducer at a lower frequency. The construction of the present invention also allows the efficient use of one or more pistons to couple the energy of the transducer to the associated medium. In addition, there is also disclosed herein a particular ring configuration for the hybrid transducer. In the ring configuration the transducer moves with maximum motion at one position and minimum motion at a position displaced 180° therefrom.

In accordance with another aspect of the present invention there is provided a transducer that is adapted for transducing between the acoustical energy and electrical energy and which is comprised of a first element having a magnetostrictive property along with associated wiring and a second element that has piezoelectric properties and also has associated wiring. These first and second elements are combined into a unitary transducer device. A pair of mass loads are provided and means are also used for securing the mass loads at respective ends of the transducer device corresponding to ends of the first and second elements. A further mass may be employed between the first and second elements. In still further segments of the invention further elements may be employed along with further associated mass loads so as to essentially linearly cascade these transducer segments in series. The masses on the ends of the device may serve as pistons to radiate sound into the medium.

In accordance with further features of the present invention the hybrid transducer may be enclosed in a tubular housing with one end being a radiating end and the other end being stationary. As previously indicated, the transducer may also be constructed in a ring configuration in which half of the ring may be piezoelectric while the other half is magnetostrictive. The resonant frequency of the ring transducer may be lowered by distributing masses along the circumference to reduce the wave speed. The masses may be attached to either the inside or the outside surface, or alternatively may be secured for example, between segments of the elements.

BRIEF DESCRIPTION OF THE DRAWINGS

Numerous other objects, features and advantageous of the invention should now become apparent upon a reading of following detailed description taken in conjunction with the accompanying drawings, in which.

DETAILED DESCRIPTION

As has been indicated previously, the transducer of the present invention is considered to be an improvement over prior hybrid transducer constructions, such as those shown in U.S. Pat. No. 4,443,731 issued Apr. 17, 1984. In this regard, refer to FIG. 1A herein which shows a transducer construction of the type described in the aforementioned U.S. patent.

The nature of the magnetostrictive and electrostriction (piezoelectric) effects is such that each are electrically 90° out of phase with each other. The 90° phase change is traced to the voltage which is developed as a result of the change in the magnetic flux. This means that for sinusoidal motion of one, the other moves cosinusoidally, each being driven with the same electrical signal (of the same electrical phase). Likewise, on reception of an acoustical signal, the two electrical outputs are 90° out of phase. This natural 90° phase difference in motion combined with a spatial distance in which an additional 90° phase shift is attained (through a distance of one quarter of one wavelength) affords summation in one direction and cancellation in the opposite direction leading to the means for a directional transducer.

Figure 1A:
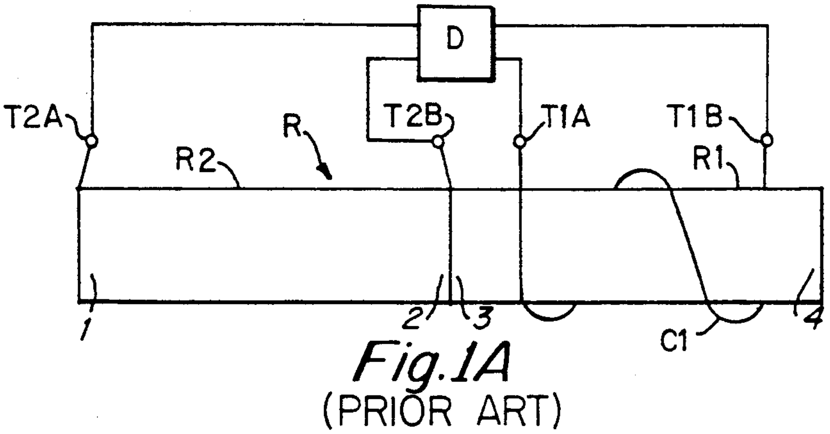
Fig.1A (PRIOR ART)
FIG. 1A is a diagram of the hybrid transducer as disclosed in the prior art.

FIG. 1A illustrates one embodiment of the present invention in the form of a transducer rod R having a magnetostrictive rod section R1 and a piezoelectric rod section R2. The section R1 has associated therewith a coil C1 having associated terminals T1A and T1B. Similarly, the piezoelectric segment R2 has terminals T2A and T2B at the ends of thereof as illustrated. In FIG. 1A the rod segment R2 has respective ends 1 and 2 while the rod segment R1 has respective ends 3 and 4. The ends of the different segments are used hereinafter in analysis of the transducer.

The magnetostrictive rod segment may be constructed of a highly active rare earth iron material. The piezoelectric rod segment may be a highly active lead zirconate titanate ceramic. Both of these segments are mechanically secured together as a single piece.

In the example illustrated in FIG. 1A, the R has a length of one half wavelength and each segment is one quarter wavelength long. Since the two different segments may not have the same sound speed, both lengths may not necessarily be the same structural length.

In FIG. 1A the transducer is illustrated as being a receiver. However, it is understood that the device may also be used as a transmitter. As a receiver it is noted that there is also provided a detector D. The terminals T1A and T2A connect in parallel to one side of the detector while the terminals T1B and T2B connect in parallel to the other side of the detector. In essence, the two rod segments are connected in parallel to the detector.

In the transducer illustrated in FIG. 1A, there is an inherent 90° phase difference between the piezoelectric and magnetostrictive elements and the quarter of wavelengths of each section. With the transducer sections arranged for equal magnetostrictive and piezoelectric activity a wave arriving from the piezoelectric end arrives at the magnetostrictive end after traveling a distance of one quarter of a wavelength. With the inherent 90° phase difference between the two types, a positive addition can be achieved at the magnetostrictive end if the magnetostrictive coil is connected for a 90° phase delay rather than a 90° phase advance. A cancellation at the piezoelectric end is achieved since the wave from the magnetostrictive end is delayed by the inherent 90° phase shift plus an additional 90° due to its quarter wavelength travel time to the piezoelectric end where cancellation occurs due to the total 180° phase shift.

A reversal of the wires results in a reversal of the direction of uni-directionality. In either instance, in accordance with the present invention there is provided sufficient mass loading so that secondary waves generated at the vibrating surface do not propagate to the opposite end and produce significant vibration. In this regard, an experimental device has been constructed and measured and has achieved an average front-to-back ratio of 17 dB (Paper UU15, J. Acoustic. Soc. Am. Suppl. 1, Vol. 85, Spring 1989). Further improvement appears possible.

For proper operation the linear type hybrid has a quarter wavelength acoustic path length in each of the materials. This results in a transducer which is considerably long for some applications. The key to reducing the size for the same operating frequency is to add mass and/or compliance in a proper and proportional manner.

In the hybrid transducer the mass and/or compliance is added proportionally to achieve proper wave addition at one end and cancellation on the opposite end. In effect one reduces the speed for the compressional waves so they arrive at opposite ends at the proper times. That is, the speed is reduced so that the required coincidence occurs at a lower frequency.

The speed of sound $C=F\lambda=\lambda/T$, where $\lambda$ is the wavelength of sound in the medium, F the frequency of vibration and T is the period of vibration. For a quarter wave section of length $L=\lambda/4$ one finds that $F=C/4L$ or $T=4L/C$. Thus or a given length, a reduction of the sound speed means a lower frequency of operation, or longer period of T. This produces the desired addition at one end and cancellation at the opposite end at a lower frequency. The sound speed is lowered by a periodic addition of mass, compliance or both.

Figure 1B:
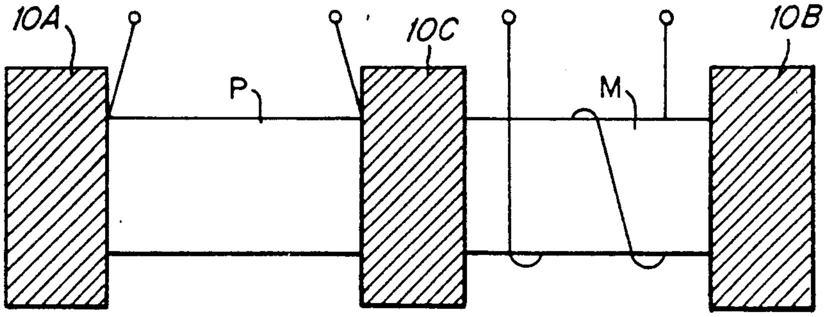
FIG. 1B discloses a first embodiment of the transducer of the present invention.

Reference is now made to the various embodiments of the invention such as illustrated in FIGS. 1B-1E. FIG. 1B illustrates the piezoelectric material P as well as the magnetostrictive material M along with the loading masses. FIG. 1B shows the use of three loading masses 10A, 10B and 10C. The masses 10A and 10B are at either end of the device as illustrated and the mass 10C couples between the piezoelectric and magnetostrictive materials. These masses may be constructed in a unitary manner with the piezoelectric and magnetostrictive materials.

Figure 1C:
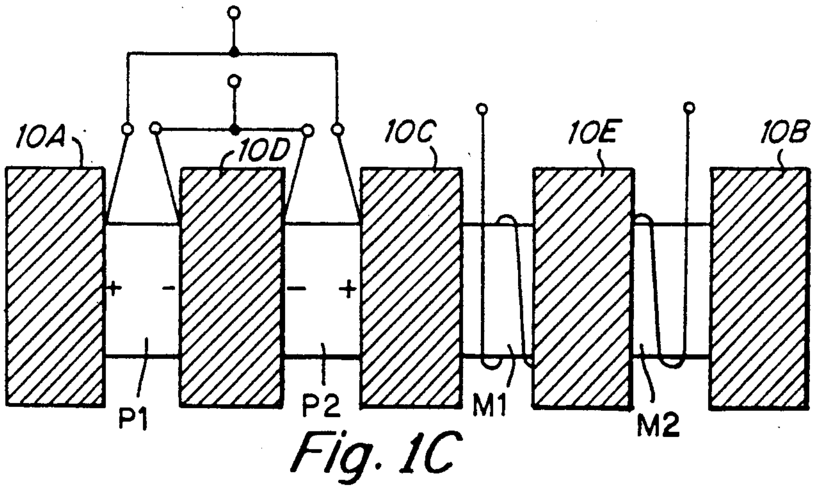
FIG. 1C discloses a second embodiment of the transducer of the present invention.
Figure 1D:
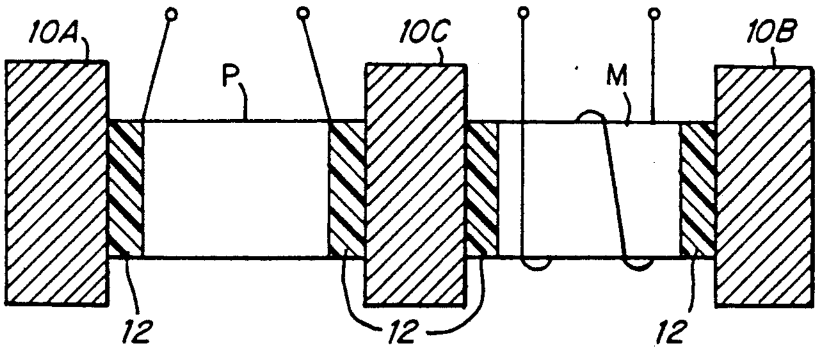
FIG. 1D illustrates still another embodiment of the present invention employing a compliant material in addition to mass loading.

FIG. 1C shows a transducer employing five separate masses. In this instance, there are two piezoelectric segments P1 and P2 as well as two magnetostrictive segments, namely segments M1 and M2. In FIG. 1C, as well as in other drawings shown herein, appropriate wiring is used such as that illustrated. In FIG. 1C five separate masses are shown illustrated as end masses 10A and 10B, center mass 10C and intermediate masses 10D and 10E.

In the embodiments in both FIGS. 1B and 1C the masses on the ends are considered as serving as pistons to radiate sound into the medium. The sound speed may be slowed even more by the addition of a compliant material along the length of the transducer rod. This may be accomplished by the use of compliant material as part of the masses or next to the masses. In this regard, refer to FIG. 1D that shows compliant material 12 being used adjacent to the masses 10A, 10B and 10C.

The masses that are schematically illustrated herein, may be constructed, for example, of brass or steel. The compliant material 12 illustrated in FIG. 1D may be constructed of any material such as a glass reinforced plastic.

Figure 1E:
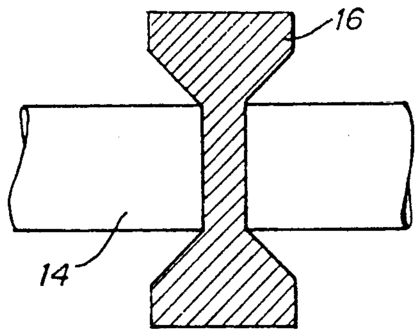
FIG. 1E is a fragmentary view of an alternate construction for the mass load.

It is significant that one use too mùch compliant material as this will reduce the coupling coefficient of the transducer. Moreover, the masses that are employed need not be of the type illustrated in FIGS. 1B–1D. A preferred mass construction is illustrated at 16 in FIG. 1E. FIG. 1E is a fragmentary cross sectional view illustrating the mass 16 as well as the active material at 14. In the cross-sectional view of FIG. 1E the mass has a tapered construction which allows significant mass loading but without displacing significant amounts of active transducer material.

Figure 2A:
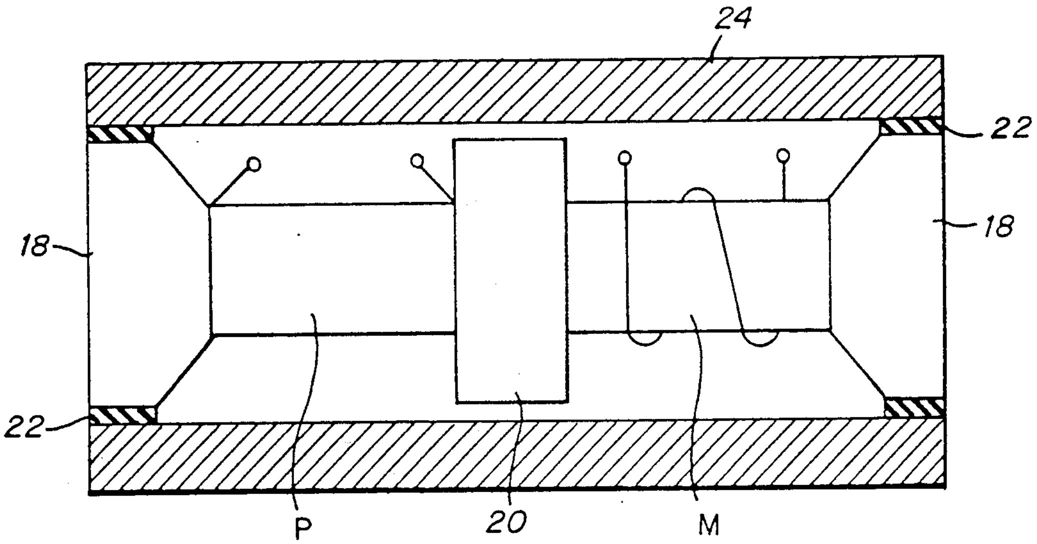
FIG. 2A illustrates another embodiment of the transducer of the present invention as contained in a tubular housing.

A transducer construction, such as that illustrated in FIG. 1B may be contained in a tubular housing. In this regard, refer to an alternate embodiment of the invention such as that shown in FIG. 2A which shows a transducer with piezoelectric material or rod P as well as magnetostrictive material or rod M. Appropriate wiring is associate with each of these materials. There is a center mass 20 as well as partially tapered outer masses 18. This construction is contained within a tubular housing 24. In particular, between the end masses 18 and tubular housing 24 there may be provided a soft rubber isolation ring 22.

Figure 2B:
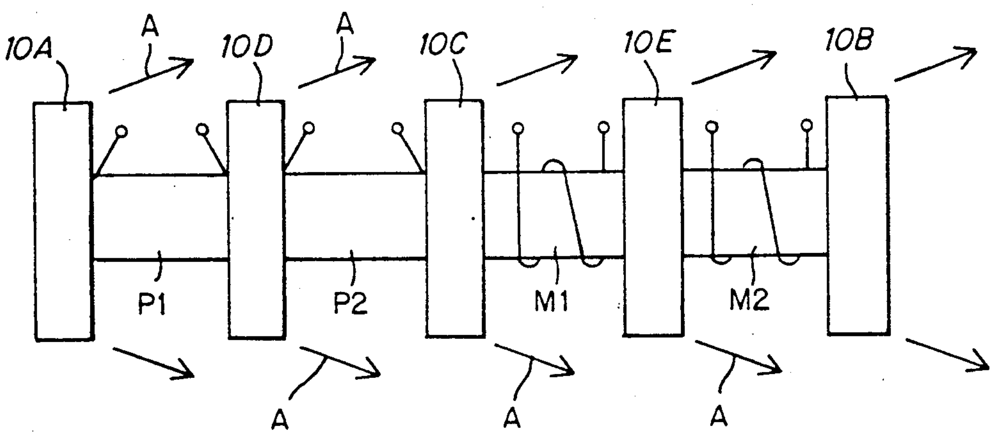
FIG. 2B illustrates another embodiment of the present invention similar to that disclosed in FIG. 1C.

The embodiment illustrated in FIG. 1C may also be contained in a housing. The configuration of FIG. 1C may also be operated under free flooding with the medium in contact with the masses acting as pistons. This is the embodiment that is illustrated in FIG. 2B. This operation would be particularly efficient if the mass loading were sufficient to reduce the wave speed in the hybrid transducer to the sound speed in the medium. In this case the waves radiating from the annular pistons (masses 10A–10E flows) arrive at the following annular pistons at the same time that the energized waves of the transducer arrive. This coincidence results in the launching of an end fired wave that is the sum of all the energy traveling down the transducer. Accordingly, the hybrid transducer of the present invention can be readily used in a multi segment array configuration such as that illustrated in FIG. 2B providing enhanced signal coupling particularly for an end fired launching of waves. In this regard refer to the acoustic radiation illustrated by the arrows A in FIG. 2B.

Figure 3:
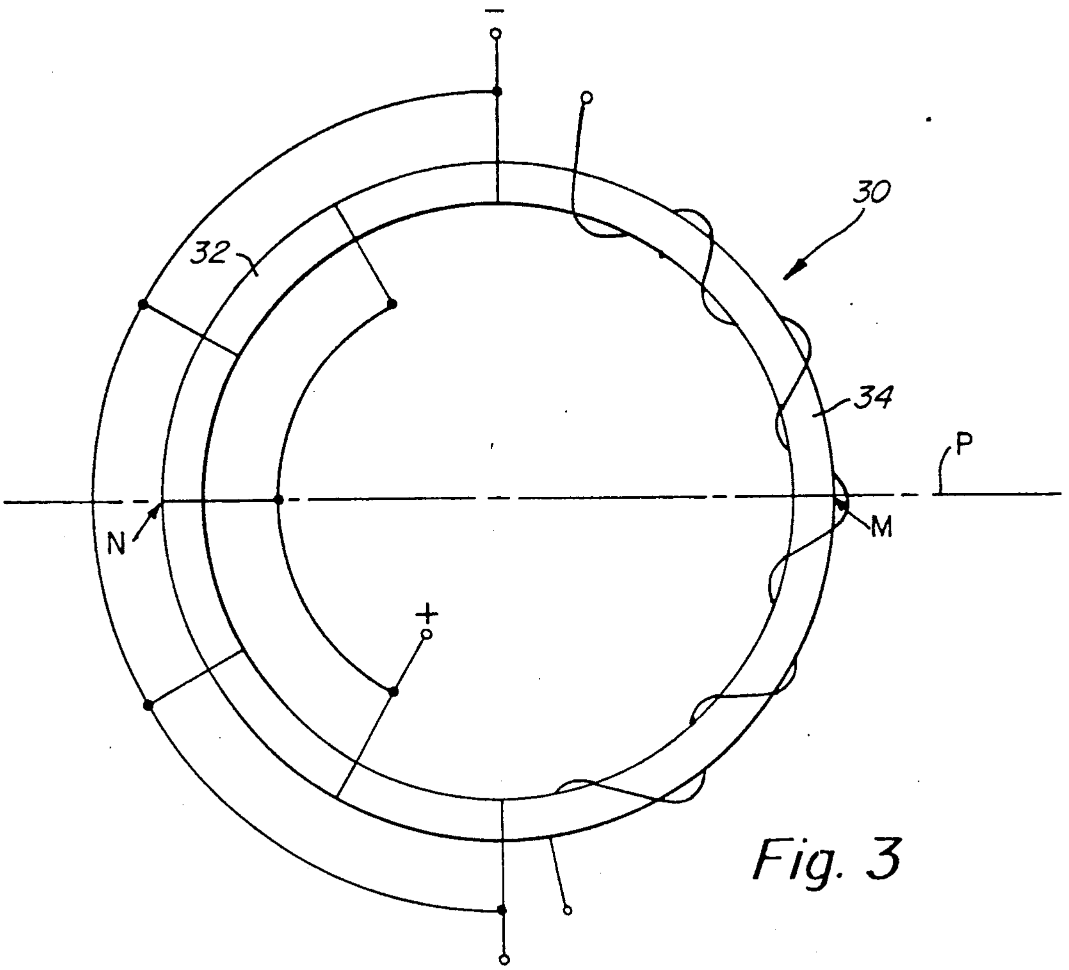
FIG. 3 illustrates the ring configuration embodiment of the transducer of the present invention.

The hybrid transducer of the present invention may also be constructed in a ring configuration such as is illustrated in FIG. 3 herein. It is noted in FIG. 3 that one half of the ring is constructed of a piezoelectric material. This is the half segment 32. The other half segment 34 is constructed of magnetostrictive material. The fundamental ring mode occurs when the circumference of the ring is equal to one half wavelength in length. At this frequency, the circumference alternately increases and decreases in size resulting in a radial increase and decrease in the circumference sending radiation into the medium.

In the hybrid ring transducer of FIG. 3 each half of the centerline may be considered as a one half wavelength hybrid section. In this case one may imagine the sections to be wired for a null at position N and an enhanced motion at position M. Since each half is in intimate contact at the midplane P, the portion at position M moves out radially due to the increase in size. There is no circumferential motion at point N since this is a point of no motion for the hybrid half sections. This results in no excited radial motion in this region although there may be some small residual reactive motion.

Figure 4:
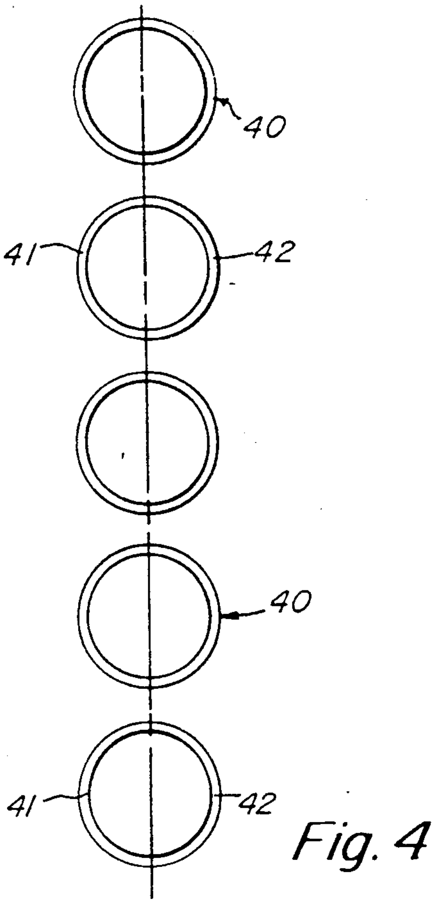
FIG. 4 schematically illustrates a transducer array in accordance with the present invention.

In one embodiment an array of the transducers may be formed by a number of rings that are stacked on top of each other to form a long cylinder. Alternatively, the cylinders may be stacked side by side such as in the manner illustrated in FIG. 4 herein. FIG. 4 schematically shows an array of cylinders in which they are stacked side by side along a linear path. Each ring 40 may be of the type as illustrated in FIG. 3 having a piezoelectric side 41 and a magnetostrictive side 42.

In an array arrangement such as that illustrated in FIG. 4 herein, adjacent elements baffle sound that may be diffracted around the elements. In this case, the element need not be large compared to the sound wavelength to obtain acoustic directionality from the directional mechanical motion of the hybrid ring transducer.

As in the embodiments of the invention illustrated in FIG. 1B–1E, the resonant frequency of the ring configuration may also be lowered by distributing masses along the circumference thereof to reduce the wave speed. The masses may be attached to the inside or the outside surface where they may be part of the radiating surface. In this regard refer FIGS. 3A–3C.

Figure 3A:
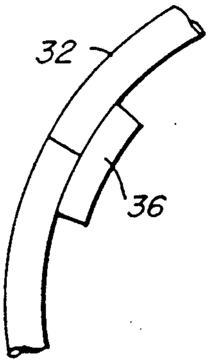
FIG. 3A is a fragmentary view showing mass loading for the ring configuration wherein the mass is disposed on the inside surface of the ring.

FIG. 3A shows the use of an internally disposed mass 36 on the inner side of the ring at the piezoelectric side. It is preferred that in actual practice any masses be disposed in a uniform manner along the circumference. thereof to reduce the wave speed. The masses may be attached to the inside or the outside surface where they may be part of the radiating surface. In this regard refer FIGS. 3A–3C.

FIG. 1A shows the use of an internally disposed mass 36 on the inner side of the ring at the piezoelectric side. It is preferred that in actual practice any masses be disposed in a uniform manner along the circumference.

Figure 3B:
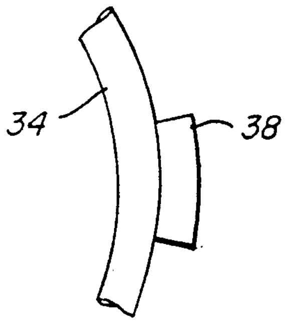
FIG. 3B is a fragmentary view illustrating mass loading wherein the mass loading for the ring configuration wherein the mass loading is disposed on the outside surface of the ring.

FIG. 3B shows a mass 38 disposed on the outside of the ring. Likewise, in this embodiment any masses that are employed should be disposed in a uniform manner on the outer surface about the circumference.

Figure 3C:
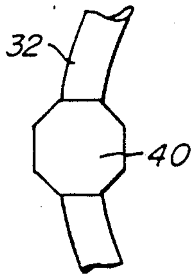
FIG. 3C is a fragmentary view showing mass loading in the ring configuration disposed within the ring itself.

FIG. 3C shows a mass 40 that is actually constructed in the ring itself. In the various embodiments of FIGS. 3A–3C, it is noted that these masses as described may be associated either with the piezoelectric o magnetostrictive portion of the ring configuration.

Figure 5:
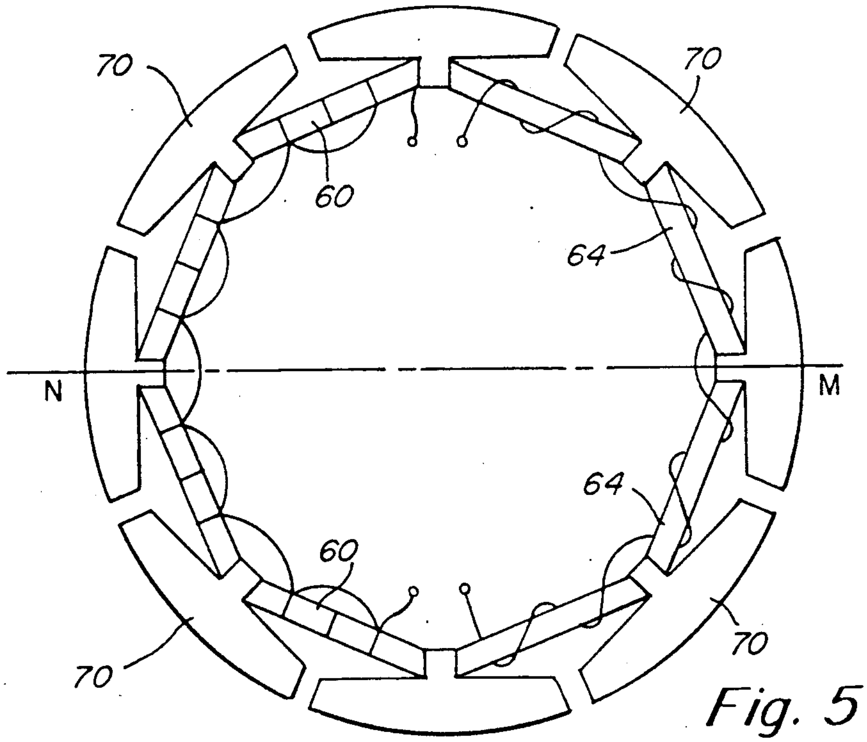
FIG. 5 illustrates another embodiment of a ring configuration in accordance with the present invention.

Reference is now made to FIG. 5 for a complete embodiment in accordance with the present invention. This embodiment is in a ring configuration and employs both piezoelectric and magnetostrictive segments. As in the embodiment of FIG. 3, the sections may be wired for a null at position N and enhanced motion at position M.

More particularly, the hybrid ring transducer of FIG. 5 includes piezoelectric elements 60 on one side as well as magnetostrictive elements 64 on the other side. FIG. 5 illustrates the appropriate wiring for each of the elements. Intermediate each of the elements on the outer side of the ring are disposed a series of spaced masses 70.

The opposite ends of the ring configuration of FIG. 5 may be capped to prevent thė outside fluid from filling in the inside volume of the ring. On the other hand, free-flooded interior resonances may be desired in some operations as in the case of a Helmholtz type resonator. In such case, no complete capping would be used.

Having now describe a limited number of embodiments of the present invention, it should now be apparent to those skilled in that art that numerous other embodiments and modifications thereof are contemplated as falling within the scope of the present invention as defined by the appended claims.

What is claimed:

1. A transducer including means for combining acoustical energy and electrical energy and comprising; a first element having magnetostrictive properties and associated wiring, a second element having piezoelectric properties and associated wiring, means for combining both said elements into a unitary transducer device, a plurality of mass loads, and means securing the mass loads to the transducer device so as to reduce the wave speed and provide operation at a reduced frequency, wherein said first element comprises two segments and said second element comprises two segments and furthermore including at least five mass loads.

2. A transducer as set forth in claim 1 further including a compliant material associated with said mass loads.

3. A transducer as set forth in claim 2 wherein said compliant material comprises a glass reinforced plastic.

4. A transducer as set forth in claim 3 wherein said mass loads each comprise a dense metal.

5. A transducer as set forth in claim 2 wherein said compliant material forms a part of the mass.

6. A transducer as set forth in claim 2 wherein said compliant material is disposed next to the mass load.

7. A transducer as set forth in claim 1 including a further mass load disposed between the first and second elements.

8. A transducer as set froth in claim 7 further including second and third mass loads disposed at opposite free ends of respective first and second elements.

9. A transducer as set forth in claim 1 wherein the mass loads each comprise a relatively thin central body and outwardly tapered enlarged mass ends.

10. The transducer as set forth in claim 1 further a tubular housing for containing said elements and mass loads.

11. A transducer as set forth in claim 1 wherein said elements are formed in a ring configuration.

12. A transducer as set forth in claim 11 wherein the ring is comprised of first and second elements each forming half of the ring configuration and joined into a unitary structure that forms a complete 360° ring.

13. A transducer including means for combining acoustical energy and electrical energy and comprising; a first element having magnetostrictive properties and associated wiring, a second element having piezoelectric properties and associated wiring, means for combining both said elements into a unitary transducer device, said first and second elements forming a closed ring, said transducer uni-directionality being established by cancellation of motion at one side of the transducer ring, a plurality of mass loads, and means securing the mass loads to the transducer device so as to reduce the wave speed and provide operation at a reduced frequency.

14. A transducer as set forth in claim 13 wherein said mass loads are disposed along the circumference of the ring on the inside thereof.

15. A transducer as set forth in claim 13 wherein said mass loads are disposed along the circumference of the ring on the outside.

16. A transducer as set forth in claim 13 wherein said mass loads are disposed along the circumference within the ring.

17. A transducer as set forth in claim 13 wherein both said first and second elements comprise plural elements having a mass load disposed between each one thereof.

18. A transducer as set forth in claim 13 further comprising a plurality of said closed rings stacked to form a cylindrical transducer.

19. A transducer as set forth in claim 18 including an array of cylindrical stacks forming a transducer array.

20. A transducer including means for combining acoustical energy and electrical energy and comprising; a first element having magnetostrictive properties and associated wiring, a second element having piezoelectric properties and associated wiring, means for combining both said elements into a unitary transducer device, a plurality of mass loads, and means securing the mass loads to the transducer device so as to reduce the wave speed and provide operation at a reduced frequency, wherein the mass loads each comprise a relatively thin central body and outwardly tapered enlarged mass ends.

21. A transducer as set forth in claim 20 further including a compliant material associated with said mass loads.

22. A transducer as set forth in claim 21 wherein said compliant material comprises a glass reinforced plastic.

23. A transducer as set forth in claim 22 wherein said mass loads each comprise a dense metal.

24. A transducer as set forth in claim 21 wherein said compliant material forms a part of the mass.

25. A transducer as set forth in claim 21 wherein said compliant material is disposed next to the mass load.

26. A transducer as set forth in claim 20 including a further mass load disposed between the first and second elements.

27. A transducer as set forth in claim 20 wherein said first element comprises two segments and said second element comprises two segments and furthermore including at least five mass loads.

28. The transducer as set forth in claim 20 further including a tubular housing for containing said elements and mass loads.

29. A transducer as set forth in claim 20 wherein said elements are formed in a ring configuration.

30. A transducer as set forth in claim 29 wherein the ring is comprised of first and second elements each forming half of the ring configuration and joined into a unitary structure that forms a complete 360° ring.

31. A transducer including means for combining acoustical energy and electrical energy and comprising; a first element having magnetostrictive properties and associated wiring, a second element having piezoelectric properties and associated wiring, means for combining both said elements into a unitary transducer device, a plurality of mass loads, and means securing the mass loads to the transducer device so as to reduce the wave speed and provide operation at a reduced frequency, wherein said elements are formed in a ring configuration and said ring is comprised of first and second elements each forming half of the ring configuration and joined into unitary structure that forms a complete 360° ring.

32. A transducer as set forth in claim 31 further including a compliant material associated with said mass loads.

33. A transducer as set forth in claim 32 wherein said compliant material comprises a glass reinforced plastic.

34. A transducer as set forth in claim 33 wherein said mass loads each comprise a dense metal.

35. A transducer as set forth in claim 32 wherein said compliant material forms a part of the mass.

36. A transducer as set forth in claim 32 wherein said compliant material is disposed next to the mass load.

37. A transducer as set forth in claim 31 including a further mass load disposed between the first and second elements.

38. A transducer as set forth in claim 31 wherein said first element comprises two segments and said second element comprises two segments and furthermore including at least five mass loads.

39. A transducer as set forth in claim 31 wherein the mass loads each comprise a relatively thin central body and outwardly tapered enlarged mass ends.

40. The transducer as set forth in claim 31 further including a tubular housing for containing said elements and mass loads.

41. A transducer as set forth in claim 40 further including a rubber mass disposed between said mass loads and said tubular housing.

42. A transducer including means for combining acoustical energy and electrical energy and comprising; a first element having magnetostrictive properties and associated wiring, a second element having piezoelectric properties and associated wiring, means for combining both said elements into a unitary transducer device, said combination including the property of having positive interference at one end of said transducer and cancelling interference at the other end of said transducer for operating uni-directionally, a plurality of mass loads, including at least one intermediate mass load being disposed between said elements, a first and second end mass load, said first end mass load being disposed at said one end of said transducer and said second end mass load being disposed at said other end of said transducer, and means securing the mass loads to the transducer device so a to reduce the wave speed and provide unidirectional operation at a reduced frequency.

43. A transducer as set forth in claim 42 further including a compliant material associated with said mass loads.

44. A transducer as set forth in claim 43 wherein said compliant material comprises a glass reinforced plastic.

45. A transducer as set forth in claim 44 wherein said mass loads each comprise a dense metal.

46. A transducer as set forth in claim 43 wherein said compliant material forms a part of the mass.

47. A transducer as set forth in claim 43 wherein said compliant material is disposed next to the mass load.

48. A transducer as set forth in claim 42 wherein said end mass loads are enlarged.

49. A transducer as set forth in claim 42 wherein said first element comprises two segments and said second element comprises two segments and furthermore including at least five mass loads.

50. A transducer as set forth in claim 42 wherein the mass loads each comprise a relatively thin central body and outwardly tapered enlarged end mass loads.

51. The transducer as set forth in claim 42 further including a tubular housing for containing said elements and mass loads.

52. A transducer as set forth in claim 42 wherein said elements are formed in a ring configuration.

53. A transducer as set forth in claim 52 wherein the ring is comprised of first and second elements each forming half of the ring configuration and joined into a unitary structure that forms a complete 360° ring.

54. A transducer including means for combining acoustical energy and electrical energy and comprising; a first element having magnetostrictive properties and associated wiring, a second element having piezoelectric properties and associated wiring, means for combining both said elements into a unitary transducer device, a plurality of mass loads, and means securing the mass loads to the transducer device so as to reduce the wave speed and provide operation at a reduced frequency, including a further substantially octagonally shaped mass load disposed between the first and second elements.

55. A transducer as set forth in claim 54 further including a compliant material associated with said mass loads.

56. A transducer as set forth in claim 55 wherein said compliant material comprises a glass reinforced plastic.

57. A transducer as est forth in claim 56 wherein said mass loads each comprise a dense metal.

58. A transducer as set forth in claim 55 wherein said compliant material forms a part of the mass.

59. A transducer as set forth in claim 55 wherein said compliant material is disposed next to the mass load.

60. A transducer as set forth in claim 54 wherein said first element comprises two segments and said second element comprises two segments and furthermore including at least five mass loads.

61. A transducer as set forth in claim 54 wherein the mass loads each comprise a relatively thin central body and outwardly tapered enlarged mass ends.

62. The transducer as set forth in claim 54 further including a tubular housing for containing said elements and mass loads.

63. A transducer as set forth in claim 54 wherein said elements are formed in a ring configuration.

64. A transducer as set forth in claim 63 wherein the ring is comprised of first and second elements each forming half of the ring configuration and joined into a unitary structure that forms a complete 360° ring.

* * * * *